United States Patent [19]

Flint et al.

[11] Patent Number: 4,685,606

[45] Date of Patent: Aug. 11, 1987

[54] OXIDE-FREE EXTRUDED THERMAL JOINT

[75] Inventors: Ephraim B. Flint, Garrison; Peter A. Gruber, Mohegan Lake; Ronald F. Marks, Ossining, all of N.Y.; Graham Olive, San Jose, Calif.; Arthur R. Zingher, White Plains, N.Y.

[73] Assignee: International Business Machines Corporation, Armonk, N.Y.

[21] Appl. No.: 861,696

[22] Filed: May 9, 1986

[51] Int. Cl.$^4$ .................................... B23K 31/02
[52] U.S. Cl. ..................................... 228/123; 72/360
[58] Field of Search ............... 228/123, 179; 72/360; 164/80, 129

[56] References Cited

U.S. PATENT DOCUMENTS

| 611,574 | 9/1898 | Gay | 72/360 |
|---|---|---|---|
| 13,140,683 | 7/1964 | Moll | 164/271 |
| 3,199,829 | 9/1965 | Calim | 164/129 |
| 4,194,672 | 3/1980 | Uto et al. | 228/194 |
| 4,483,478 | 10/1984 | Schulz | 228/157 |

FOREIGN PATENT DOCUMENTS

| 43-13542 | 6/1968 | Japan . | |
|---|---|---|---|
| 57-11760 | 1/1982 | Japan . | |
| 223132 | 12/1984 | Japan | 72/360 |
| 131033 | 3/1951 | Sweden . | |

Primary Examiner—Nicholas P. Godici
Assistant Examiner—Karen Skillman
Attorney, Agent, or Firm—Perman & Green

[57] ABSTRACT

A method of joining a thermally conductive element to an electric circuit chip for cooling the chip includes initial steps of forming an oxide-free preform of a fusible metal alloy by extrusion of alloy between two mold blocks or plates. During the extrusion, the oxide coating is left behind so that the extruded alloy is essentially free of oxide. The extrusion takes place at a temperature elevated to approximately the liquidus temperature of the alloy. The preform, which may be in the form of a pill or section of thin foil, is placed between interfacing surfaces of the thermally conductive element and the chip, and is then extruded along the interfacing surfaces under pressure and elevated temperature to form a thermally conductive, oxide-free bonding layer of superior thermal conductivity.

8 Claims, 6 Drawing Figures

OXIDE-FREE EXTRUDED THERMAL JOINT

BACKGROUND OF THE INVENTION

This invention relates to the fabrication of electric systems of semiconductor circuit chips including cooling devices connected to the chips and, more particularly, to a method of connection of a cooling device to a circuit chip by extrusion of a thermally conductive alloy free of oxide between the chip and the cooling device.

In the construction of electronic systems employing an array of electronic circuit chips interconnected via conductors in a common substrate, it is a common practice to connect thermally some form of cooling device to the circuit chips for removal of heat generated by electric currents flowing within the chips. Good thermal flow from the chips to the cooling devices is important for efficient cooling and maintenance of a desired operating temperature.

One method of interconnection of a cooling device to a chip employs a fusible alloy such as a low temperature solder which is placed between the interfacing surfaces of the cooling device and the chip. Typically, the alloy is prepared as a thin foil which is heated to approximately the liquidus temperature to soften the alloy and to allow extrusion or reflow of the alloy along the interfacing surfaces to form a thermally conductive bonding layer. A thermal bond is attained by micro-conformance of the extruded alloy to the interfacing surfaces.

A problem arises in that imperfections in the metal alloy interface with the chip such as voids, flux residue and oxides decrease the thermal conductivity of the bonding layer. The oxide is of particular concern because it readily develops on the surfaces of the foil or other form of stored alloy material. Upon emplacmeent of the alloy between the interfacing surfaces, there is sufficient oxide to significantly reduce the thermal conductivity of the bonding layer with a corresponding reduction in the efficiency of the chip cooling.

SUMMARY OF THE INVENTION

The foregoing problem is overcome and other advantages are provided by a method of joining a cooling device to a circuit chip, which method includes a preparation of an oxide-free pill-shaped preform of alloy in accordance with the invention. In one embodiment of the invention, a mold is formed of glass blocks which contain a central chamber connected to peripheral cavities. A charge of alloy material including any oxide coating which may be present is placed in the central chamber and, under elevated temperature, is extruded into the cavities. During the extrusion, the oxide coating remains in the central chamber as the alloy is squeezed out into the cavities. The alloy in the cavities is essentially free of oxide, and the cavities impart a lenticular (pill) shape to the alloy upon cooling of the mold and the alloy.

In an alternative embodiment of the invention, a section of relatively thick foil of alloy material with oxide coating thereon is placed between two glass plates, the glass plates providing a nonwetting surface to the alloy, and the glass plates are pressed together under elevated temperature to squeeze or extrude out alloy to peripheral portions of the plates. During the extrusion, the oxide coating remains in the central portion of the plates while the alloy which enters the peripheral portions of the plates is in the form of a thin film which is essentially free of oxide.

With both embodiments of the invention, the elevated temperature is at or slightly more than the liquidus temperature to soften the alloy and facilitate the extrusion. The pill of alloy from the first embodiment, or a section of the thin foil from the second embodiment is then placed between the interfacing surfaces of the cooling device, or other thermally conductive element, and the circuit chip in the presence of elevated temperature for extrusion along the interfacing surfaces to form a thermally conductive bonding layer. The bonding layer is essentially free of oxide for improved thermal conductivity.

BRIEF DESCRIPTION OF THE DRAWING

The foregoing aspects and other features of the invention are explained in the following description, taken in connection with the accompanying drawing wherein.

DETAILED DESCRIPTION

The invention relates to the joining of a thermally conductive element to an electronic circuit chip in a manner which improves thermal conductivity between the element and the chip. This is best explained by considering first the construction of an electronic system with cooling of circuit chips as presented in FIG. 1.

Figure 1:
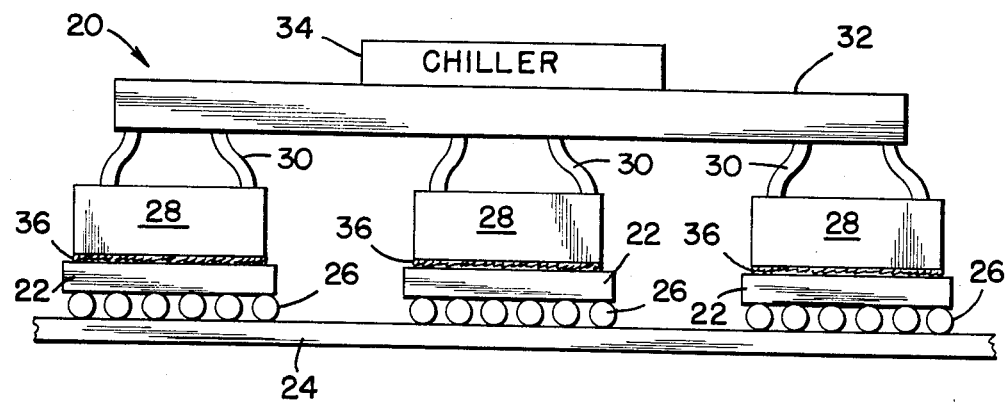
FIG. 1 is a digrammatic view of an electronic system employing circuit chips secured by thermally conductive layers to cooling devices in accordance with the invention.

FIG. 1 shows, in simplified form, an electronic system 20 comprising a set of electronic circuit chips 22 supported upon a common substrate 24. The substrate 24 includes well-known electrical conductors (not shown) for making electrical connections among circuits of the chips 22. Ball-shaped contacts 26 of soft metal are disposed between the chips 22 and the substrate 24 for electrically connecting circuit points of the chips 22 with individual ones of the conductors of the substrate 24. Thereby, the circuits of the chips 22 are interconnected to provide functions of the system 20.

As is well known, electric currents flowing in the chips 22 generate heat which must be removed in order to maintain operation of the chips 22 in their prescribed range of operating temperature. A set of cooling devices 28 are thermally connected to respective ones of the chips 22, and are further connected by coolant conduits 30 of a manifold 32 to a chiller 34. The chiller 34 provides fluid coolant to the cooling devices 28 for extraction of heat from the chips 22, thereby to maintain proper operating temperature of the chips 22.

In accordance with the invention, each of the cooling devices 28 is bonded to its corresponding chip 22 by means of an oxide-free extruded alloy layer 36 disposed along an interface between the cooling device 28 and the chip 22. Preferably, the bonding layer 36 is formed of a fusible metallic alloy having a relatively low melting temperature, for example, a low temperature solder such as a lead-indium-tin-bismuth alloy having a liquidus temperature in the range of 60-100 degrees Celsius. Such an alloy is generally nonwetting to silicon but creates a good thermal bond by micro-conforming to the surfaces to be joined. The bonding layer generally employs a thin alloy foil, 0.5 to 3 mils thick, cut to the size of the interfacing area between the device 28 and the chip 22.

Frequently, in the use of alloy bonding layers, an amount of alloy sufficient to produce a bonding layer is prepared in a convenient form, referred to as a preform, such as a section of foil suitable for emplacement between two objects which are to be joined. The two objects may be the foregoing chip and cooling device. However, such foil tends to oxidize resulting in an oxide coating which disadvantageously reduces thermal conductivity of the bonding layer. The invention provides for the preparation of alloy material in a convenient form, such as foil shaped or pill-shaped preform, without the presence of oxide so as to attain improved thermal conductivity within the bonding layer.

Figure 2:
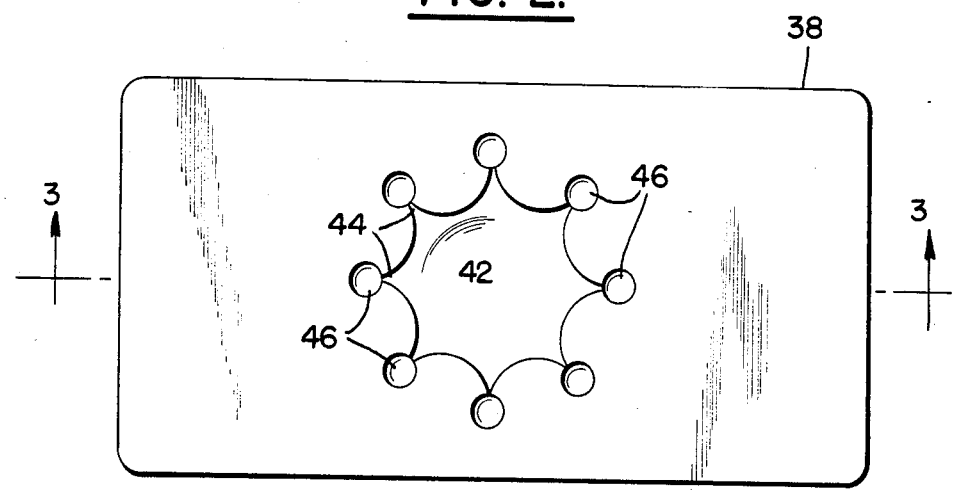
FIG. 2 is a plan view of a mold block used in fabricating an oxide free pill of alloy for forming the thermally conductive layers of FIG. 1.
Figure 3:
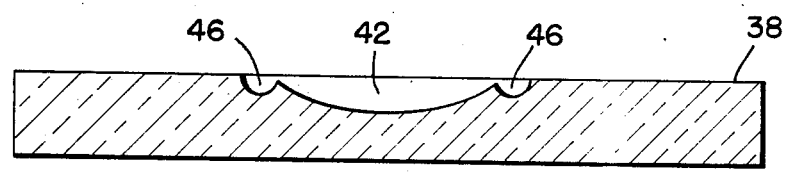
FIG. 3 is a sectional elevation view of the mold block taken along the line 3—3 in FIG. 2.
Figure 4:
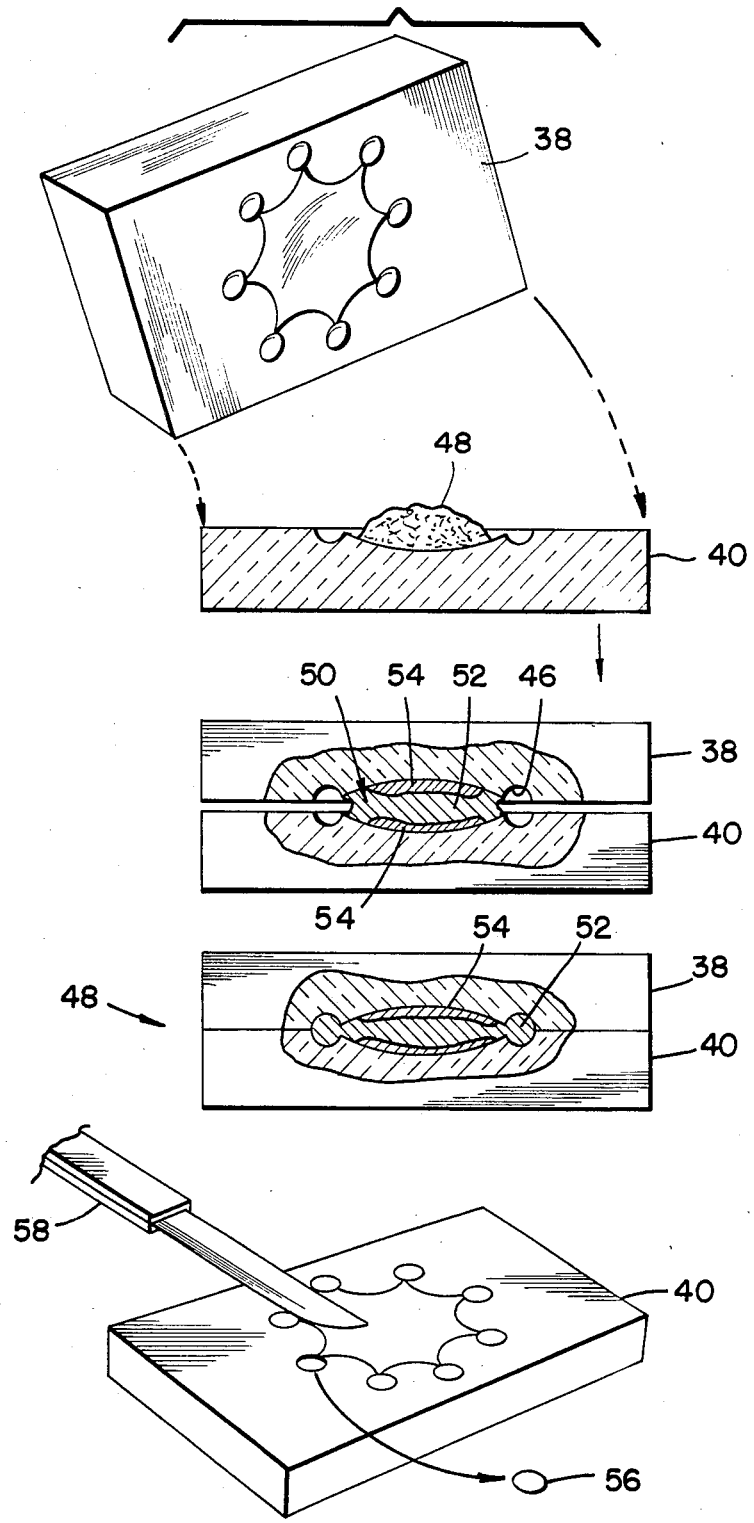
FIG. 4 shows method steps in forming a pill of oxide-free alloy with the mold block of FIGS. 2-3 in accordance with the invention.

The preparation of oxide-free alloy for the layer 36 is explained in FIGS. 2-4. A mold is formed of two identical glass blocks 38 and 40. The block 38, shown in FIGS. 2-3, will be described in detail, it being understood that the description applies equally well to the block 40. The block 38 comprises a central chamber 42 coupled by ports 44 to a set of cavities 46 disposed about the periphery of the chamber 42. The chamber 42 may be provided with a star shape, as shown in FIG. 2, or may be provided with some other convenient form such a circular shape (not shown). Eight of the cavities 46 are shown, it being understood that more or less of the cavities 46 may be positioned symmetrically about the chamber 42 as may be convenient. The depth of the chamber 42 and the depth of the cavities 46 are very small as compared to the transverse dimensions of the chamber 42 and the cavities 46. Each cavity 46 has a smooth surface formed as a section of a sphere approximately eight inches in diameter. The depth of each cavity 46 is one mil, and the diameter may be, by way of example, four millimeters (mm) to accommodate a chip size of 4.5 mm square, or six mm to accommodate a chip size of 6-7 mm square. The chamber 42 has a generally flat bottom at a depth of one mil. The diameter of the chamber 42 is approximately one inch. The configurations of the chamber 42 and the cavities 46 in the two blocks 38 and 40 are mirror images so that, upon placing one block upon the other (FIG. 4), the chambers 42 join and the cavities 46 join to produce a mold 48 for containment of alloy material.

In carrying out the method of the invention, a charge of alloy material 50 comprising alloy 52 with oxide coating 54 is placed in the central chamber 42 of the block 40, and then the block 38 is placed on top of the block 40 to form the mold 48. As the two blocks 38 and 40 are brought together, the material 50 is entrapped in the chambers 42 with alloy 52 located between top and bottom oxide coatings 54. The material 50 makes a nonwetting contact with the glass of the blocks 38 and 40. The blocks 38 and 40 are heated to approximately the liquidus temperature of the alloy 52, thereby to soften the material 50 and facilitate extrusion thereof. The blocks 38 and 40 are pressed together further, and alloy 52 is pressed out via the ports 44 to the cavities 46 leaving the oxide coating 54 in the chambers 42. In particular, it is noted that the oxide does not travel into the cavities 46 so that the cavities 46 contain oxide-free alloy 52. The cavities 46 mold the alloy 52 into a convenient form of pill-shaped preforms 56 which are extracted with the aid of a knife 58 after cooling and opening the blocks 38 and 40. The knife 58 is used to cut the portions of the alloy 52 at the locations of the ports 44, thereby to free the preforms 56 from the cavities 46.

Figure 5:
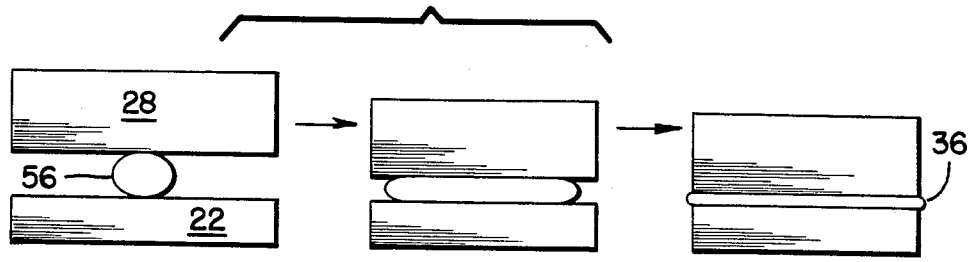
FIG. 5 shows method steps in joining the cooling device of FIG. 1 to a circuit chip.

FIG. 5 shows diagrammatically a cooling device 28 and a chip 22 of FIG. 1. In accordance with the method of the invention, a preform 56 is inserted between the device 28 and the chip 22 prior to the development of an oxide coating on the preform 56. Generally, there is a time period of at least a few hours during which the preform 56 can be exposed to the air before formation of excess oxide on the surface of the preform. In the event that the preforms are produced in advance to the time of fabrication of the system 20, then the preforms would be stored in an environment which is free of oxygen or other contaminants until needed for joining the cooling devices 28 to the chips 22.

The joining of the cooling device 28 to the chip 22 is accomplished in a standard air oven, the convex-convex shape of the preform avoiding the entrapment of air voids, and at a temperature elevated to approximately the liquidus temperature to reflow or extrude the alloy along the interfacing surfaces of the device 28 and the chip 22. As shown in FIG. 5, during the joining process, the device 28 and the chip 22 are pressed together during the elevated temperature to flatten the preform, and then to further extrude the alloy of the preform to form the bonding layer 36.

Figure 6:
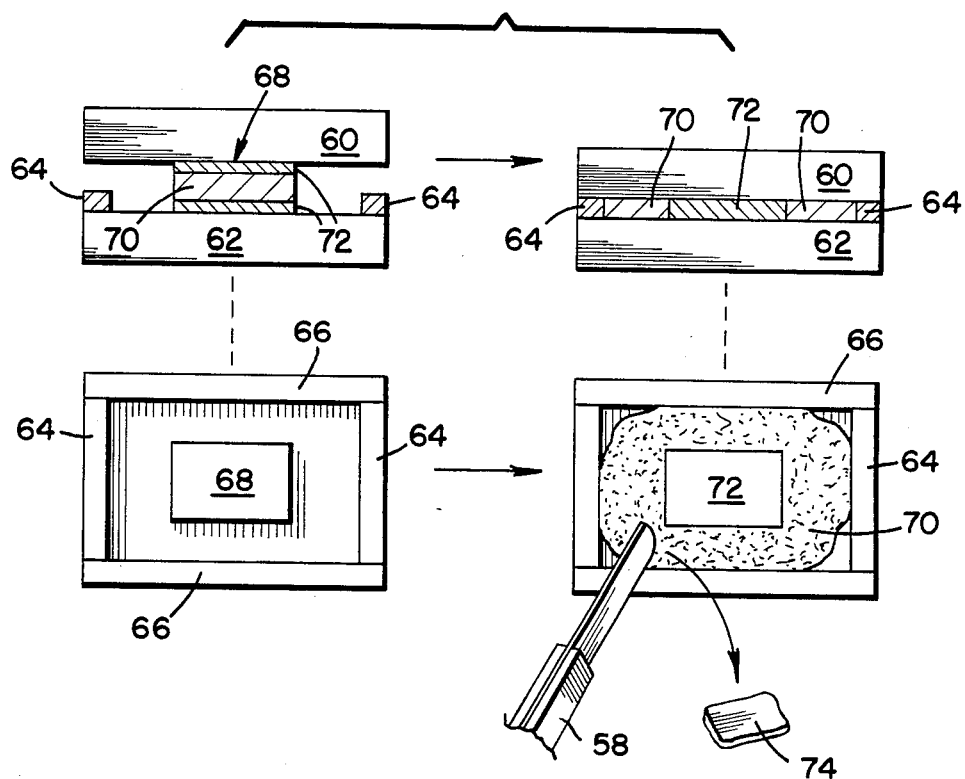
FIG. 6 shows an alternative embodiment of the method of the invention for forming a thin foil in lieu of the pill of FIG. 4.

By way of alternative embodiment of the invention, as shown in FIG. 6, a portion of alloy may be formed as a section of foil instead of a pill shape. The method of FIG. 6 employs a top plate 60 and a bottom plate 62 which face each other. Shims 64 and 66 are placed along short and long sides of the perimeter of the surface of the bottom plate 62 facing the top plate 60. A portion of alloy material 68, such as a wafer thereof, is centered between the two plates 60 and 62. The material 68 has a central portion of metal alloy 70 bounded on top and bottom surfaces with a metal oxide coating 72. The temperature of the material 68 and the plates 60 and 62 is raised approximately to the liquidus temperature of the alloy 70 to soften the material 68 and facilitate extrusion thereof. The two plates 60 and 62 are forced together causing the alloy 70 to be squeezed out as a foil from between the coatings 72 and to fill most of the space enclosed by the shims 64 and 66. FIG. 6 shows both plan and sectional views of the material 68, both before and after extrusion. During the extrusion, the oxide coatings 72 adhere to the plates 60 and 62, thereby allowing the remaining portion of the material 68, namely the alloy 70, to be free of the oxide. The plates 60 and 62 may be made of glass to provide nonwetting surfaces to the alloy 70. Thereafter, the blocks 60 and 62 are separated and the knife 58 is used to cut out a section of alloy foil 74. The section of foil 74 is then employed in lieu of the pill-shaped preform 56 in carrying out the method of FIG. 5 to join the cooling device 28 to the chip 22. However, when utilizing the section of foil 74, the reflow operation is accomplished in a vacuum oven to avoid entrapping air between the cooling device 28 and chip 22. Preferably, the reflow operation is accomplished by placing the cooling device 28 and chip 22, with a section of foil 74 interposed therebetween, within the vacuum oven. The oven is then evacuated and the temperature of the oven raised to a temperature at which the reflow of the foil 74 is accomplished. The oven is then repressurized with an inert gas or air and allowed to cool. The plates 60 may also be used for storage of the foil, the plates being kept closed together to protect the alloy 70 from contamination.

As a further embodiment of the invention, it is possible to utilize the teaching of FIG. 6 to join the cooling device 28 to the chip 22 directly without separately forming the section of foil 74. This is accomplished by placing the alloy material 68 directly between the device 28 and the chip 22 instead of the plates 60 and 62. Upon elevating the temperature and pressing the device 28 and the chip 22 together, the material 68 spreads out in the same fashion as shown in FIG. 6 to provide a bonding layer which differs from the layer 36 (FIG. 1) in that the oxide coating 72 is located in the middle of the layer while the rest of the layer is formed of hte oxide-free alloy 70. This procedure is advantageous in that it is simpler, but suffers the disadvantage in that the bonding layer is not as good a conductor of heat due to the oxide coating 72 in the middle of the layer.

With respect to the shape of the solder or alloy preform to be used in forming the thermally conductive bonding layer, it is noted that the pill-shaped preform 56 is preferable to the section of foil 74 for reasons which become apparent upon examination of FIG. 5. The preform 56 initially has a very smooth surface due to the smooth surfaces of the cavities 46. As the cooling device 28 and the chip 22 draw closer together, the preform 56 uniformly expands in the lateral direction to drive out any environmental gases which may be present in the extrusion apparatus. This prevents the formation of voids which would impede with the conduction of heat. In the case of the section of foil 74, the foil is already flat and, accordingly, the mode of expansion during the extrusion is less likely to prevent the formation of voids thereby requiring the operation to be carried out in a vacuum oven as has been previously described. For the foregoing reasons, the method employing the pill-shaped preform, as disclosed in FIGS. 2-5, is preferred.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

Having thus described our invention, what we claim as new, and desire to secure by Letters Patent is:

1. A method of attachment of a heat-conductive element to an electric circuit chip comprising the steps of:
   placing a charge of a thermally conductive alloy in a chamber assembly;
   heating the alloy to approximately the liquidus temperature thereof to facilitate extrusion of the alloy;
   pressing the alloy within said chamber assembly to extrude a portion of the alloy away from the site of said charge, any oxide present on a surface of the charge remaining in the vicinity of the charge during extrusion of the alloy, an extruded portion being free of the oxide;
   positioning said extruded portion between said heat-conductive element and said chip; and
   forcing said heat-conductive element against said chip to extrude the alloy of said portion along an interface between said element and said chip.

2. A method according to claim 1 wherein said step of forcing is accomplished at a temperature elevated to approximately the liquidus temperature of said alloy to facilitate extrusion of the alloy.

3. A method according to claim 2 further comprising a step of cooling said chip and said heat-conductive element upon completion of said step of forcing.

4. A method according to claim 1 wherein said extruded portion is in the form of a foil, and wherein said step of forcing is accomplished in a vacuum oven to avoid entrapment of air.

5. A method according to claim 4 further comprising a step of cutting a section of said foil for use in said step of positioning.

6. A method according to claim 1 wherein said chamber assembly includes a chamber for holding said charge and a cavity communicating with said chamber for receiving said extruded portion, said step of pressing forming a pill of oxide-free extruded alloy within said cavity, any oxide present on a surface of the charge remaining in said chamber during extrusion of the alloy into said cavity.

7. A method according to claim 6 further comprising a step of extracting said pill from said cavity prior to said step of positioning.

8. A method according to claim 1 wherein said extruded portion is in the form of a pill having a smooth convex surface, and wherein said step of forcing is accomplished in an air oven, the smooth convex shape avoiding entrapment of air.

* * * * *